United States Patent

Ryu

[11] Patent Number: 6,100,666
[45] Date of Patent: Aug. 8, 2000

[54] METHOD FOR CALIBRATING RECHARGEABLE BATTERY CAPACITY

[75] Inventor: Chang-Hyun Ryu, Kyunggi-do, Rep. of Korea

[73] Assignee: SamSung Electronics Co., Ltd., Suwon, Rep. of Korea

[21] Appl. No.: 09/333,262

[22] Filed: Jun. 15, 1999

[30] Foreign Application Priority Data

Jun. 15, 1998 [KR] Rep. of Korea ..................... 98-22436

[51] Int. Cl.[7] .......................... H01M 10/44; H01M 10/46
[52] U.S. Cl. .............................................................. 320/132
[58] Field of Search ................................. 320/132, 125, 320/135, 149, DIG. 21; 324/427, 429, 433; 429/90; 340/635, 636

[56] References Cited

U.S. PATENT DOCUMENTS

| | | |
|---|---|---|
| 3,969,667 | 7/1976 | McWilliams . |
| 4,151,454 | 4/1979 | Iida . |
| 4,207,611 | 6/1980 | Gordon . |
| 4,290,002 | 9/1981 | Piotti . |
| 4,912,392 | 3/1990 | Faulkner . |
| 5,140,269 | 8/1992 | Champlin . |
| 5,268,845 | 12/1993 | Startup et al. . |
| 5,315,228 | 5/1994 | Hess et al. . |
| 5,363,689 | 11/1994 | Hoffmann et al. . |
| 5,472,056 | 12/1995 | Orbach . |
| 5,563,496 | 10/1996 | McClure . |
| 5,596,260 | 1/1997 | Moravec et al. . |

*Primary Examiner*—Edward H. Tso
*Attorney, Agent, or Firm*—Robert E. Bushnell, Esq.

[57] ABSTRACT

A smart battery provides electrical power and reports remaining capacity of the battery. A disparity between the calculated remaining capacity and the actual capacity of the smart battery is calibrated through a maximum power consumption mode. Specifically, a maximum power consumption mode is set, the battery is discharged until a battery capacity learning level is reached, the battery capacity is determined, and the system is then set to a minimum power consumption mode. Power management function is disabled prior to the latter process, and enabled after the process is completed.

33 Claims, 4 Drawing Sheets

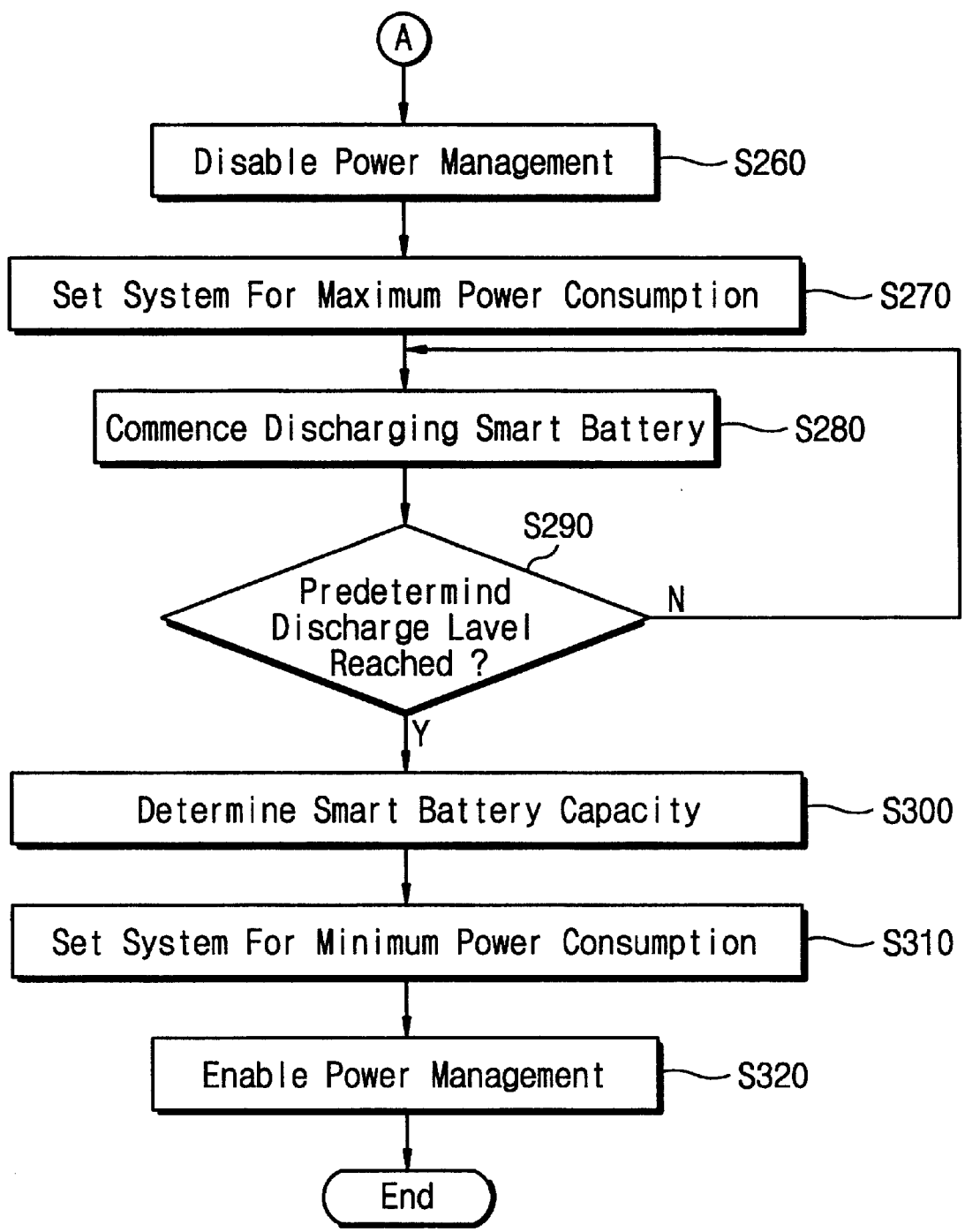

METHOD FOR CALIBRATING RECHARGEABLE BATTERY CAPACITY

CLAIM OF PRIORITY

This application makes reference to, incorporates the same herein, and claims all benefits accruing under 35 U.S.C. §119 from my application A CALIBRATING METHOD OF RECHARGEABLE BATTERY CAPACITY filed with the Korean Industrial Property Office on Jun. 15, 1998 and there duly assigned Serial No. 22436/1998.

BACKGROUND OF THE INVENTION

1. Technical Field

The present invention relates generally to battery-powered electronic devices and, more particularly, to a method of calibrating capacities of rechargeable batteries.

2. Related Art

Rechargeable batteries are presently used in many portable electronic devices, such as computers, camcorders, and mobile phones. Such devices are also capable of utilizing alternating current (AC) power. Battery power is utilized when AC power is not convenient or is not available.

Various types of rechargeable batteries are known to be used in such applications. For example, nickel-cadmium (NiCad), nickel metal hydride (NiMH), and lithium ion batteries are used.

Typically, a portable computer system is powered by either a smart rechargeable battery pack or by alternating current (AC) through an AC-to-DC adapter. Such smart batteries typically include memory storage devices, and some smart battery packs include a microcontroller.

With respect to the smart batteries, it is important to provide accurate information regarding the remaining capacities of the batteries. Some smart batteries incorporate "fuel gauge" functions, by which the charge levels of the batteries can be indicated. An example of rechargeable batteries with such fuel gauge functions is described in U.S. Pat. No. 5,315,228. Typically, a rechargeable battery measures its discharge current, estimates its self-discharge, and predicts its remaining capacity.

In most portable computers, a power management system's prediction of run time remaining and a user's actual run time do not correspond. This disparity may increase when usage patterns vary widely.

The typical fuel gauge approach simply uses a recent value for average current consumption to calculate the remaining run time of the system. This may provide inaccurate information as to the remaining capacity of the battery. If, for example, the remaining run time of the system reported from the fuel gauge is shorter than its actual run time, then the user cannot consume its full battery capacity. Conversely, if the remaining run time of the system reported from the fuel gauge is longer than its actual run time, the portable computer system will be shut down before the calculated run time.

One solution to the foregoing problem is to correct the graduations of the battery capacity, which is usually called "battery calibration". Prior to calibration, a battery must be fully charged. The fully charged battery is fully discharged for an exact learning of the battery capacity. However, the calibration of a battery takes a long time (i.e., about 2–3 hours) because of its long discharge time. Considering total time of the calibrating process, the discharging process occupies the majority of the total time. In order to reduce the calibration time of a battery, its faster discharge is demanded.

The following patents are considered to be representative of the prior art relative to the invention disclosed herein, but are burdened by the disadvantages set forth above:

U.S. Pat. No. 4,151,454 for Remaining Capacity Detector of a Battery issued to Iida; U.S. Pat. No. 3,969,667 for Device for Determining the State of Charge in Batteries issued to McWilliams; U.S. Pat. No. 4,207,611 for Apparatus and Method for Calibrated Testing of a Vehicle Electrical System issued to Gordon; U.S. Pat. No. 4,290,002 for Method and Apparatus for Controlling Battery Recharging issued to Piotti; U.S. Pat. No. 4,912,392 for Battery Charge State Monitor issued to Faulkner; U.S. Pat. No. 5,140,269 for Electronic Tester for Assessing Battery/Cell Capacity issued to Champlin; U.S. Pat. No. 5,268,845 for Method for Detecting Low Battery State Without Precise Calibration issued to Startup et al.; U.S. Pat. No. 5.363,689 for Calibration Device for Leak Detecting Instruments issued to Hoffmann et al.; U.S. Pat. No. 5,472,056 for Control System for Agricultural Vehicle and Calibration Method for Such Control Systems issued to Orbach; U.S. Pat. No. 5,563,496 for Battery Monitoring and Charging Control Unit issued to McClure; and U.S. Pat. No. 5,596,260 for Apparatus and Method for Determining a Charge of a Battery issued to Moravec et al.

SUMMARY OF THE INVENTION

It is, therefore, an object of the present invention to provide a faster calibration method for rechargeable batteries used for portable electronic systems.

The above object, other objects, features, and advantages of the present invention will be realized and attained by a calibration method of rechargeable batteries provided for portable electronic systems, wherein the systems are set to their maximum power consumption modes during calibration, the rechargeable batteries are discharged, the capacities of the rechargeable batteries are determined, and the systems are set to their minimum power consumption modes.

BRIEF DESCRIPTION OF THE DRAWINGS

A more complete appreciation of the invention, and may of the attendant advantages, thereof, will be readily apparent as the same becomes better understood by reference to the following detailed description when considered in conjunction with the accompanying drawings in which like reference symbols indicate the same or similar components, wherein:

FIG. 3A and FIG. 3B are flowcharts illustrating a method for calibrating a rechargeable battery according to the present invention.

DESCRIPTION OF THE PREFERRED EMBODIMENT

Figure 1:
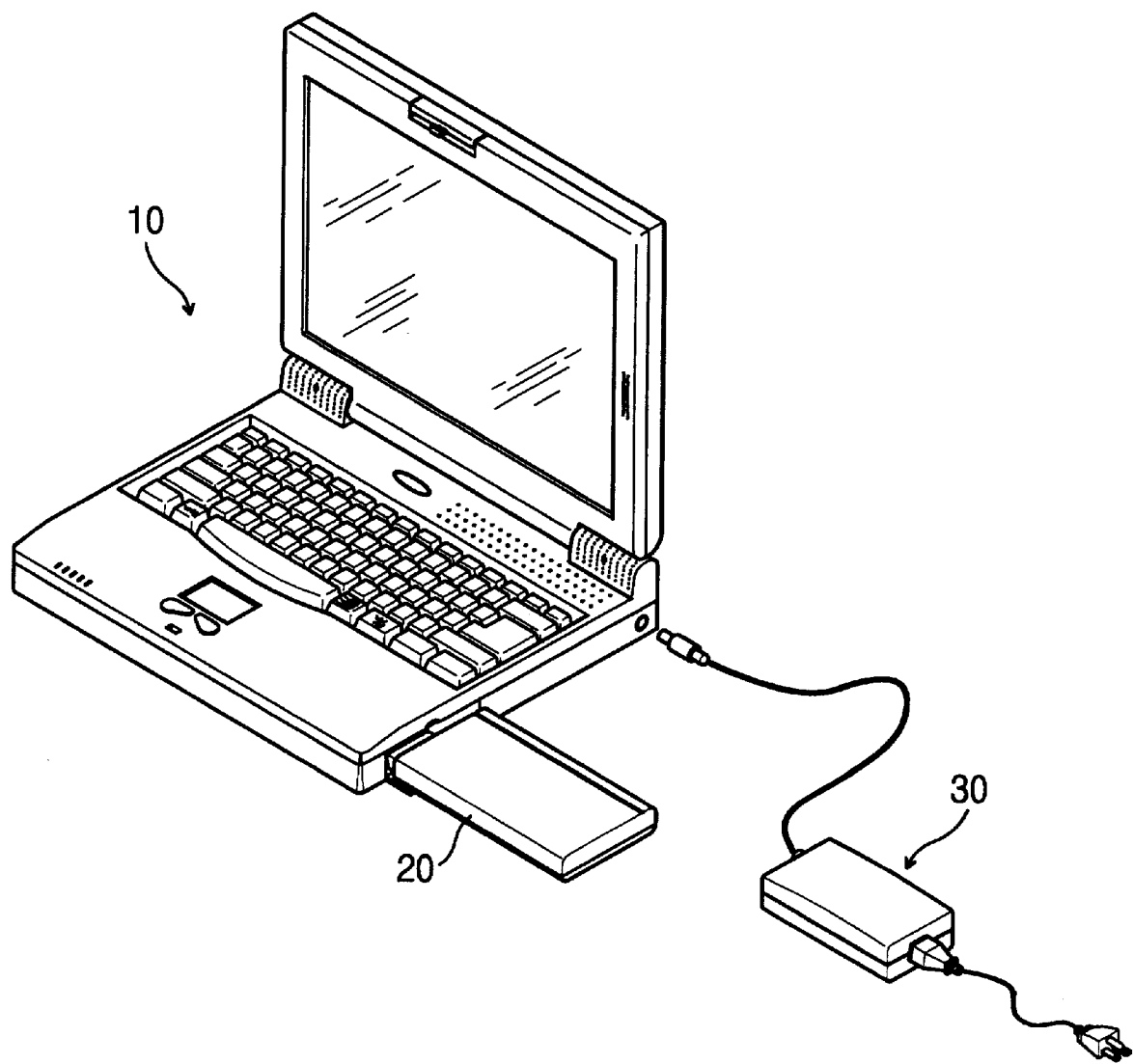
FIG. 1 is a schematic perspective view illustrating a portable computer system.

FIG. 1 is a schematic perspective view of a portable computer system 10. Referring to FIG. 1, the computer system 10 is powered by either a smart rechargeable battery pack 20 or an AC-to-DC adapter 30. Smart batteries normally include memory storage devices which contain information regarding their characteristics and types. Some smart battery packs include a microcontroller which allows communication, by way of a bi-directional communication line, with the battery charger regarding various battery characteristics. Such smart batteries are disclosed in, for example, "Smart battery Specifications" by Duracell Inc. and Intel Corporation.

Figure 2:
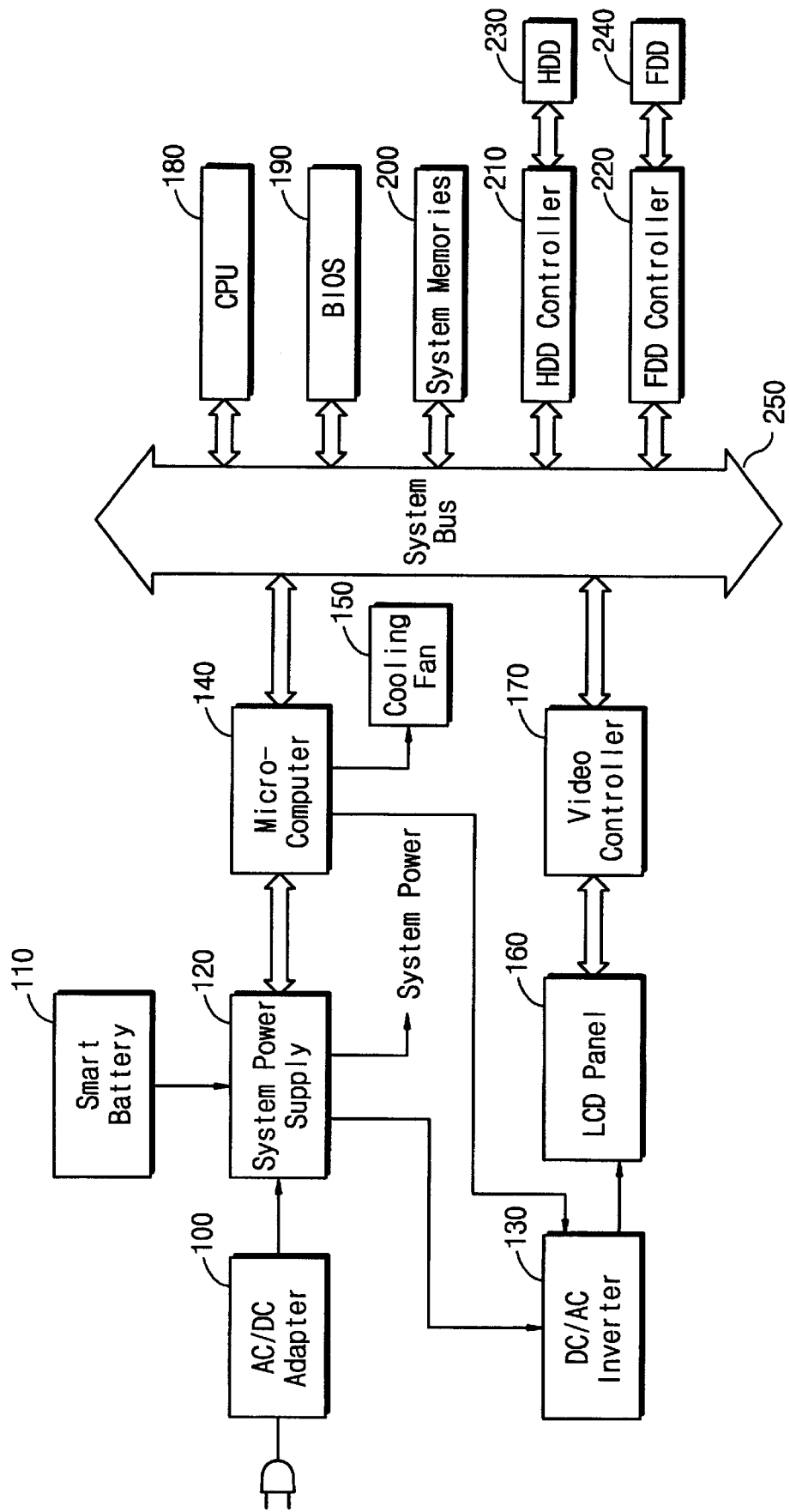
FIG. 2 is a block diagram illustrating a portable computer system powered from a smart battery according to an embodiment of the present invention.

FIG. 2 is a block diagram which illustrates a portable computer system powered from a smart battery according to an embodiment of the present invention. Referring to FIG. 2, the portable computer system comprises an AC-to-DC adapter 100, a smart rechargeable battery 110 including an embedded microcontroller (not shown) and embedded storage devices (not shown), and a system power supply 120 which generates system power by using power from the AC-to-DC adapter 100 or the battery 110. The system power supply 120 is coupled to a DC/AC inverter 130 and a microcomputer 140, respectively. The microcomputer 140 is coupled to the DC/AC inverter 130, a cooling fan 150, and a system bus 250. A central processing unit (CPU) 180, a basic input/output system (BIOS) 190, one or more system memories 200, and a video controller 170 are commonly coupled to the system bus 250. A flat panel display 160, such as a liquid crystal display (LCD) panel, is coupled between the DC/AC inverter 130 and the video controller 170. In addition, a hard disk drive (HDD) 230 and a floppy disk drive (FDD) 240 are coupled to the system bus 250 through an HDD controller 210 and an FDD controller 220, respectively.

The BIOS 190 contains control logic for calibrating the capacity of the smart battery 110 according to the present invention. A calibration mode for a calibrating process is selected in a system setup (usually called CMOS setup) program.

During the calibrating process, the microcomputer 140 controls charging/discharging operations of the rechargeable battery 110 by generating a plurality of control signals. In particular, the microcomputer 140 sets the portable computer system to consume maximum power for fast discharge of the battery 110.

For example, during the maximum power consumption mode, the system memories 200 are recursively accessed, the LCD panel 160 is driven to have a maximum brightness, and the cooling fan 150 and motors of the HDD drive 230 and FDD drive 240 are driven at their maximum speed by the control signals from the microcomputer 140. Thus, discharging of the smart battery is performed rapidly during calibration. As a result, the calibrating process can be performed rapidly.

Generally, calibration of the capacity of the smart battery 110 is carried out after the battery 110 has been fully charged. Further, the calibration is executed when removal of the AC-to-DC adapter 100 from the system is ensured. Accordingly, although a user selects the battery calibration mode, the mode will not be entered unless the battery 110 is fully charged and the AC-to-DC adapter 100 is removed. This calibration process will be described in detail below with reference to figures of accompanying drawings.

Figure 3A:
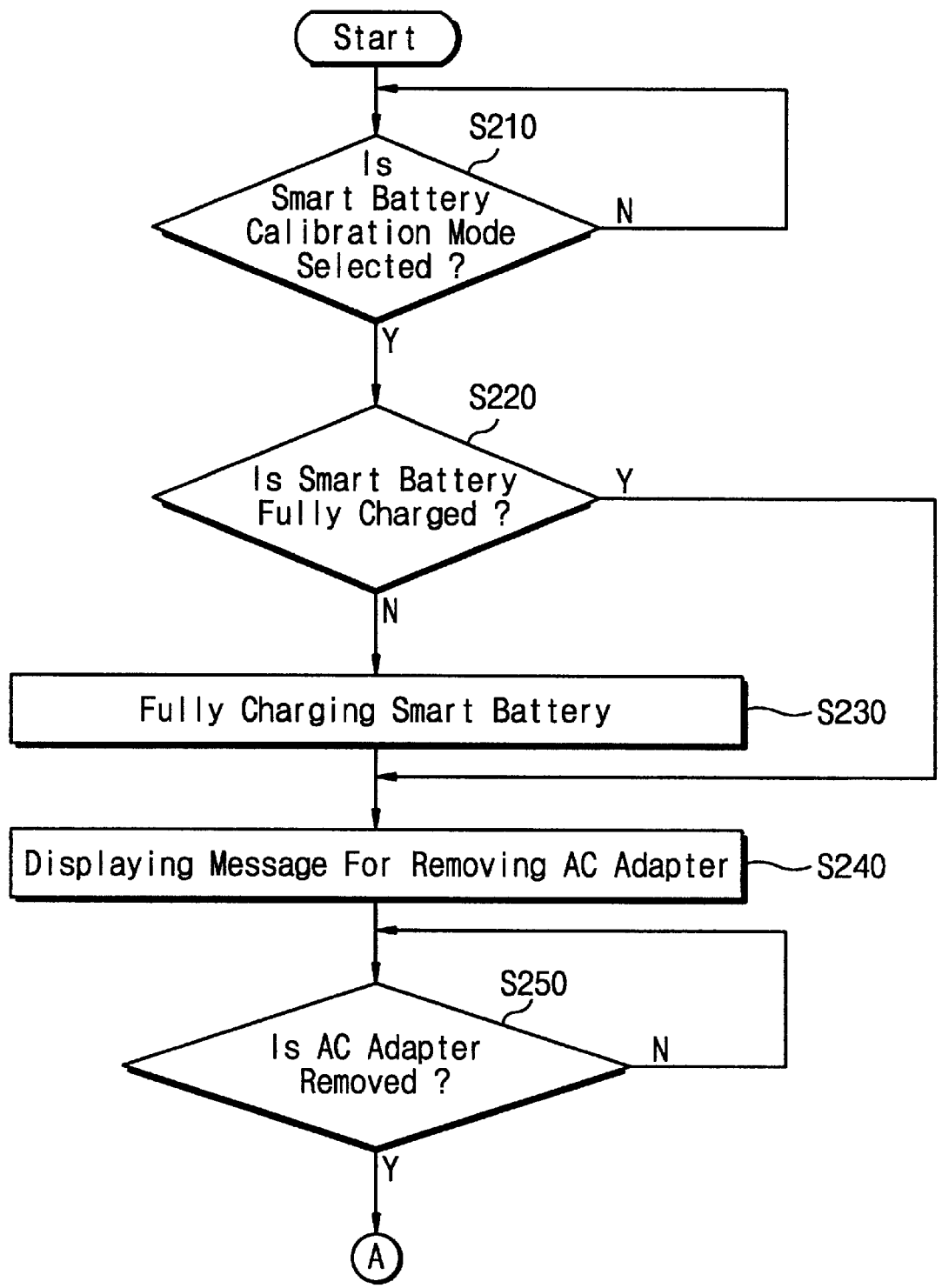

FIG. 3A and FIG. 3B are flowcharts illustrating a calibration method of a smart rechargeable battery according to the present invention. The steps of the flowcharts are performed by the microcomputer 140 and the smart battery 110.

Referring to FIG. 3A and FIG. 3B, at step S210, a determination is made as to whether the smart battery calibration mode is selected by use of the system setup program. If so, control flow proceeds to the next step S220, wherein it is asked whether the smart battery 110 is fully charged. If so, flow proceeds to step S240, but if not, flow proceeds to step S230 wherein the smart battery 110 is fully charged, and then to step S240. At step S240, a message for removing the AC-to-DC adapter 100 is displayed on the LCD panel 160, and then flow advances to step S250. In step S250, a determination is made as to whether the AC-to-DC adapter 100 is removed. If so, flow continues to step S260. At step S260, the power management function is disabled for the beginning of the actual calibration process. In step S270, the microcomputer 140 sets the portable computer system to its maximum power consumption mode. In step S280, the smart battery 110 begins to be discharged. Next, in step S290, a determination is made, at predetermined time intervals, as to whether the smart battery is discharged to a battery capacity learning level (that is, to a predetermined level where battery capacity can be learned). If so, the flow continues to step S300, wherein the capacity of the smart battery 110 is learned so as to obtain its correct capacity value. In step S310, the microcomputer 140 sets the portable computer system to its minimum power consumption mode. In step S320, the power management function is enabled and the calibrating process is terminated.

After the calibration of the smart battery capacity, when the user connects the AC adapter 100 to the portable computer system, the discharged smart battery 110 is fully charged.

As described above, the disparity between the predicted run time and the actual run time is calibrated through the foregoing calibration process of the smart battery 110. Furthermore, calibration is performed rapidly by the fast discharge of the smart battery with maximum power consumption.

While the invention has been described in terms of an exemplary embodiment, it is contemplated that it may be practiced as outlined above with modifications within the spirit and scope of the appended claims.

What is claimed is:

1. A method of calibrating a capacity of a rechargeable battery providing power for a portable electronic system, the method comprising the steps of:

setting the system to a maximum power consumption mode;

discharging the rechargeable battery;

determining the capacity of the rechargeable battery; and setting the system to a minimum power consumption mode;

wherein the portable electronic system includes a power management function, and wherein the method further comprises the steps of disabling the power management function before said determining step, and enabling the power management function after said determining step.

2. The method of claim 1, wherein the rechargeable battery is a smart battery which has a microcontroller and at least one storage device therein.

3. The method of claim 1, wherein the portable electronic system is a portable computer.

4. The method of claim 3, wherein the portable computer includes at least one system memory, a liquid crystal display device, a cooling fan, a hard disk drive motor, and a fixed disk drive motor.

5. The method of claim 4, wherein, during the maximum power consumption mode, said at least one system memory is recursively accessed, said LCD device is driven to have a maximum brightness, and said cooling fan, said hard disk drive motor and said fixed disk drive motors are each driven at their maximum speed.

6. The method of claim 1, further comprising the step, between the discharging and determining steps, of determining whether a discharge level at which the capacity of the rechargeable battery can be learned has been reached.

7. The method of claim 6, wherein the discharging step is continued until the discharge level at which the capacity of the rechargeable battery can be learned is reached, and wherein the step of determining the capacity of the rechargeable battery is executed when the discharge level at which the capacity of the rechargeable battery can be learned is reached.

8. The method of claim 1, further comprising the step, prior to the setting step, of fully charging the rechargeable battery.

9. The method of claim 8, further comprising the step, after the fully charging step, of disconnecting an alternating current adapter from the rechargeable battery.

10. The method of claim 1, further comprising the step, prior to the setting step, of disconnecting an alternating current adapter from the rechargeable battery.

11. The method of claim 1, wherein the discharging step is continued until a discharge level at which the capacity of the rechargeable battery can be learned is reached, and wherein the determining step is executed when the discharge level at which the capacity of the rechargeable battery can be learned is reached.

12. A method of calibrating a capacity of a rechargeable battery providing power for a portable electronic system, the method comprising the steps of:

discharging the rechargeable battery;

determining whether a discharge level at which the capacity of the rechargeable battery can be learned is reached;

when it is determined that the discharge level at which the capacity of the rechargeable battery can be learned is not reached, continuing to discharge the rechargeable battery until the discharge level at which the capacity of the rechargeable battery can be learned is reached; and determining the capacity of the rechargeable battery when the discharge level at which the capacity of the rechargeable battery can be learned is reached;

wherein the portable electronic system includes a power management function, and wherein the method further comprises the steps of disabling the power management function before said determining step, and enabling the power management function after said determining step.

13. The method of claim 12, wherein the rechargeable battery is a smart battery which has a microcontroller and at least one storage device therein.

14. The method of claim 12, wherein the portable electronic system is a portable computer.

15. The method of claim 14, wherein the portable computer includes at least one system memory, a liquid crystal display device, a cooling fan, a hard disk drive motor, and a fixed disk drive motor.

16. The method of claim 15, wherein, during the maximum power consumption mode, said at least one system memory is recursively accessed, said LCD device is driven to have a maximum brightness, and said cooling fan, said hard disk drive motor and said fixed disk drive motors are each driven at their maximum speed.

17. The method of claim 12, further comprising the step, prior to the discharging step, of setting the system to a maximum power consumption mode.

18. The method of claim 17, further comprising the step, prior to the setting step, of fully charging the rechargeable battery.

19. The method of claim 18, further comprising the step, after the fully charging step, of disconnecting an alternating current adapter from the rechargeable battery.

20. The method of claim 17, further comprising the step, prior to the setting step, of disconnecting an alternating current adapter from the rechargeable battery.

21. The method of claim 12, further comprising the step, after the determining step, of setting the system to a minimum power consumption mode.

22. A method of calibrating a capacity of a rechargeable battery providing power for a portable electronic system, the method comprising the steps of:

discharging the rechargeable battery; and determining the capacity of the rechargeable battery;

wherein the portable system includes a power management function, and wherein the method further comprises the step of disabling the power management function before said determining step.

23. The method of claim 22, wherein the rechargeable battery is a smart battery which has a microcontroller and at least one storage device therein.

24. The method of claim 22, wherein the portable electronic system is a portable computer.

25. The method of claim 24, wherein the portable computer includes at least one system memory, a liquid crystal display device, a cooling fan, a hard disk drive motor, and a fixed disk drive motor.

26. The method of claim 25, further comprising the step, prior to the discharging step, of setting the system to a maximum power consumption mode, and wherein, during the maximum power consumption mode, said at least one system memory is recursively accessed, said LCD device is driven to have a maximum brightness, and said cooling fan, said hard disk drive motor and said fixed disk drive motors are each driven at their maximum speed.

27. The method of claim 22, further comprising the step, between the discharging and determining steps, of determining whether a certain discharge level, at which the capacity of the rechargeable battery can be learned, has been reached.

28. The method of claim 27, wherein the discharging step is continued until the certain discharge level is reached, and wherein the step of determining the capacity of the rechargeable battery is executed when the certain discharge level is reached.

29. The method of claim 22, further comprising the step, prior to the discharging step, of fully charging the rechargeable battery.

30. The method of claim 29, further comprising the step, after the fully charging step, of disconnecting an alternating current adapter from the rechargeable battery.

31. The method of claim 22, further comprising the step, prior to the discharging step, of disconnecting an alternating current adapter from the rechargeable battery.

32. The method of claim 22, wherein the discharging step is continued until a certain discharge level, at which the capacity of the rechargeable battery can be learned, is reached, and wherein the determining step is executed when the certain discharge level is reached.

33. The method of claim 22, further comprising the step of enabling the power management function after said determining step.

* * * * *